(12) United States Patent
Jung et al.

(10) Patent No.: US 7,883,945 B2
(45) Date of Patent: Feb. 8, 2011

(54) ARRAY SUBSTRATE AND METHOD OF MANUFACTURING THE SAME

(75) Inventors: Jin-Goo Jung, Seoul (KR); Hyun-Uk Oh, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 278 days.

(21) Appl. No.: 11/835,904

(22) Filed: Aug. 8, 2007

(65) Prior Publication Data

US 2008/0035937 A1 Feb. 14, 2008

(30) Foreign Application Priority Data

Aug. 9, 2006 (KR) ...................... 10-2006-0074993

(51) Int. Cl.
*H01L 21/84* (2006.01)
(52) U.S. Cl. ...................... 438/152; 438/155; 438/694; 257/E21.035; 257/E21.036
(58) Field of Classification Search ................. 438/149, 438/151, 152, 155, 531, 694, FOR. 388; 257/E21.023, E21.035, E21.036
See application file for complete search history.

(56) References Cited

U.S. PATENT DOCUMENTS

| 6,563,136 B2 * | 5/2003 | Kunii ........................... 257/72 |
| 6,875,644 B2 * | 4/2005 | Park et al. .................... 438/151 |
| 6,902,969 B2 * | 6/2005 | Adetutu et al. .............. 438/199 |
| 2001/0010391 A1 * | 8/2001 | Nakajima et al. ........... 257/618 |
| 2007/0040174 A1 * | 2/2007 | Kim et al. ..................... 257/59 |

* cited by examiner

*Primary Examiner*—Matthew S Smith
*Assistant Examiner*—Quovaunda Jefferson
(74) *Attorney, Agent, or Firm*—F. Chau & Associates, LLC

(57) ABSTRACT

A method or manufacturing an array substrate at a low cost. Silicon patterns are formed. A first impurity is implanted at a high concentration. Gate metal patterns are formed. A second impurity is implanted. The first impurity is implanted at a low concentration. A pixel electrode is formed. The first impurity is simultaneously implanted into partial portions of the pixel pattern part, the storage pattern part, and the driving pattern part.

16 Claims, 24 Drawing Sheets

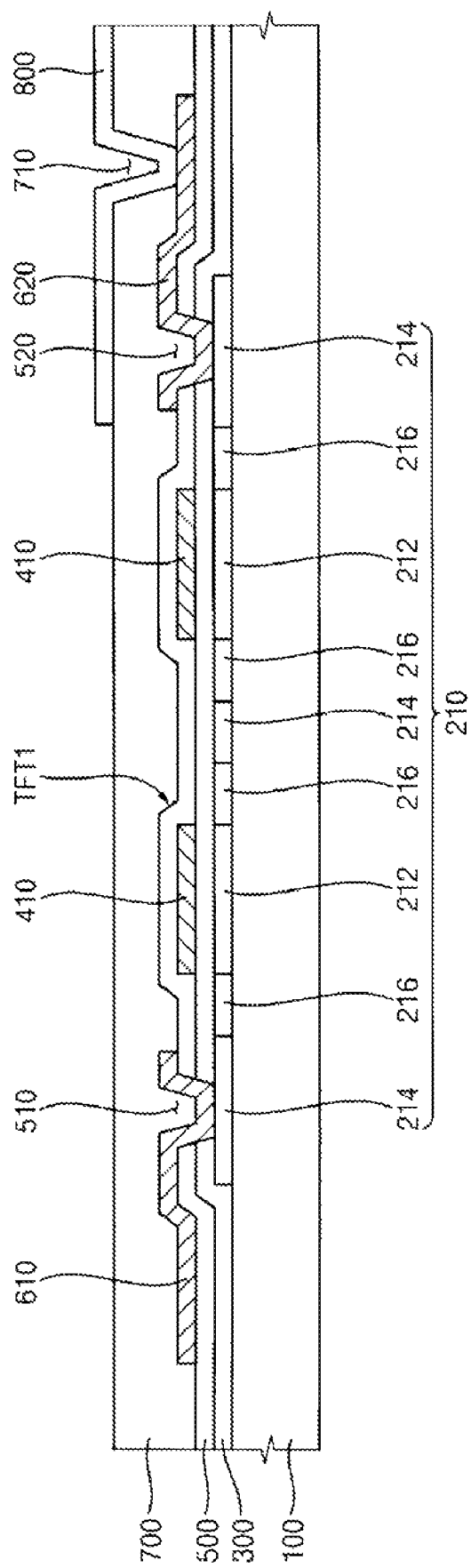

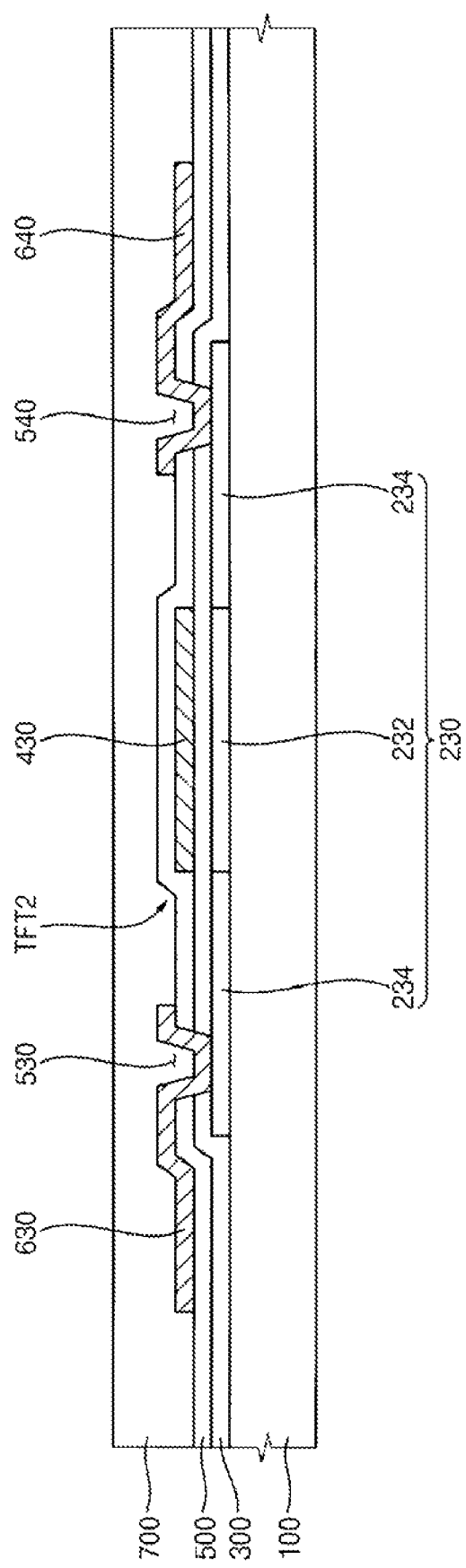

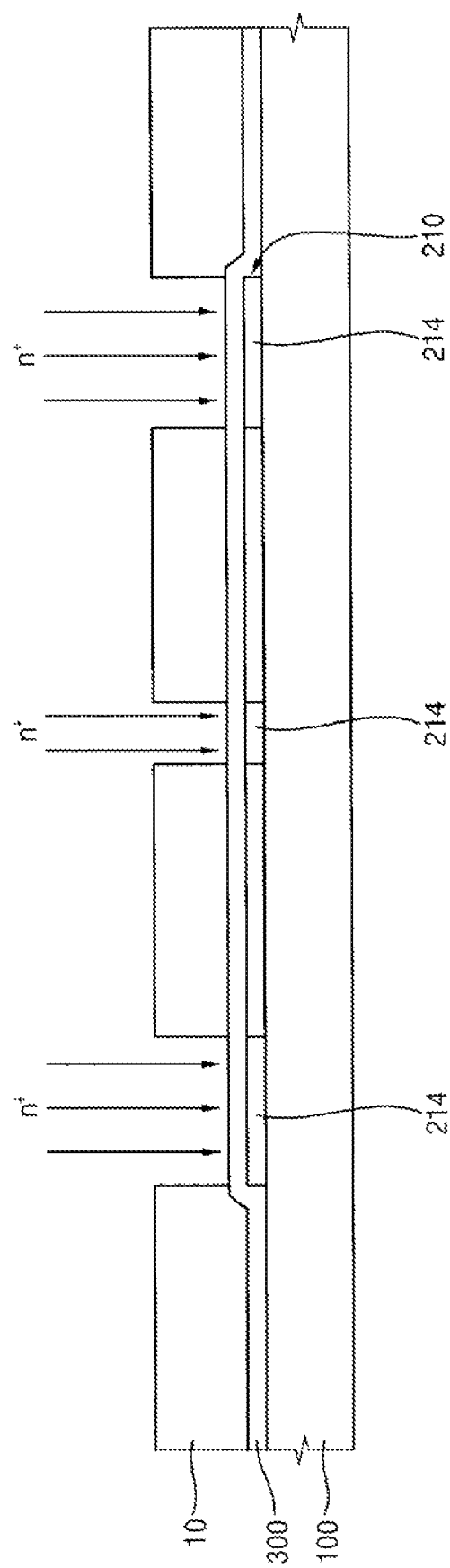

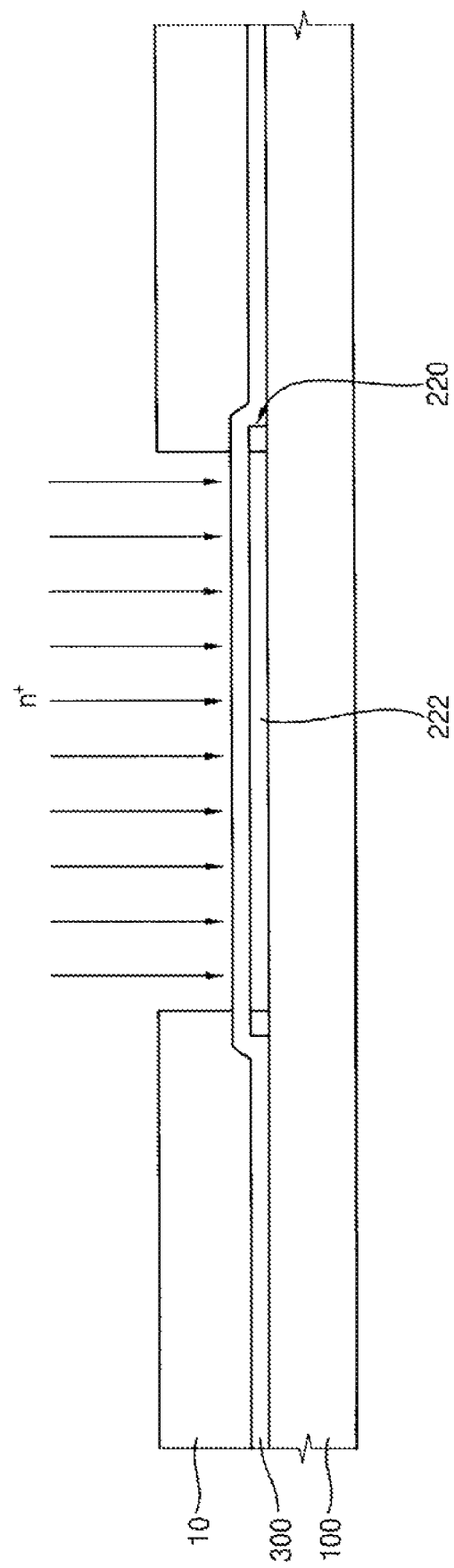

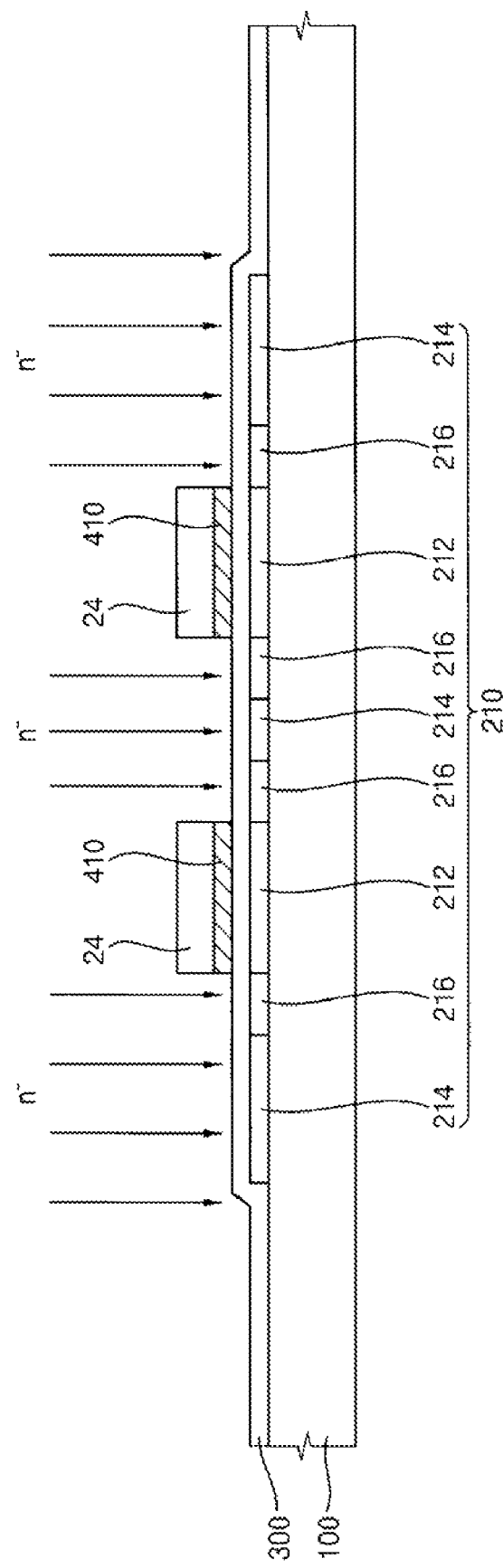

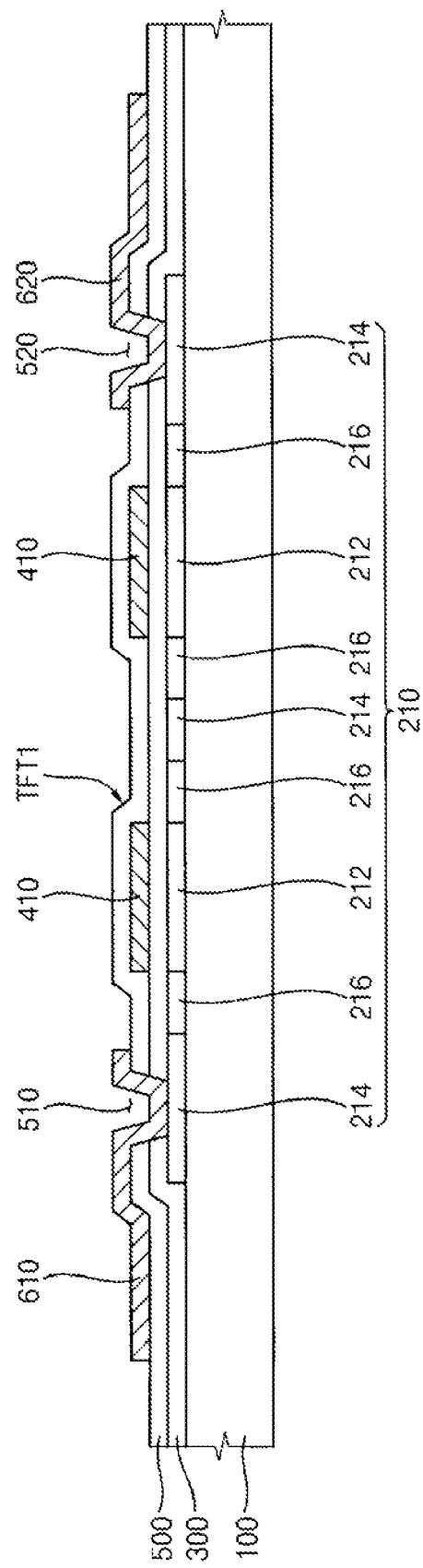

ARRAY SUBSTRATE AND METHOD OF MANUFACTURING THE SAME

CROSS-REFERENCE TO RELATED APPLICATION

This application claims priority upon Korea Patent Application No. 10-2006-0074993 filed on Aug. 9, 2006, the contents of which are herein incorporated by reference in its entirety.

BACKGROUND OF THE INVENTION

1. Technical Field

The present disclosure relates to a substrate, and more particularly, to an array substrate and a method of manufacturing the array substrate.

2. Discussion of the Related Art

Generally, a liquid crystal display (LCD) device includes an LCD panel for displaying an image and a backlight assembly for supplying the LCD panel with light. The LCD panel includes an array substrate having a thin film transistor and a pixel electrode, a color filter substrate having color filters, and a liquid crystal layer inserted between the array substrate and the color filter substrate. The thin film transistor of the array substrate includes a gate electrode, a source electrode, a drain electrode and a channel layer.

A poly silicon layer having high electric conductivity may be patterned to form the channel layer. A complex driving circuit including a plurality of thin film transistors having the channel layer including a poly silicon layer is formed in the array substrate. The driving circuit is composed of a complementary metal-oxide semi-conductor (CMOS) circuit including an n-type thin film transistor and a p-type thin film transistor.

The storage electrode is formed on the array substrate. The storage electrode partially overlaps the pixel electrode. The storage electrode and the pixel electrode overlap with the storage electrode to form a storage capacitor. A high concentration ion doping silicon layer, which is implanted with a high concentration of ions of group-V elements, is formed under the storage electrode. The high concentration ion doping silicon layer is spaced apart from the storage electrode. The high concentration ion doping silicon layer and the storage electrode spaced apart from the high concentration ion doping silicon layer form a stabilized capacitor.

An n-typed thin film transistor, a p-type thin film transistor, and the high concentration ion doping silicon layer are formed in the array substrate. The n-type thin film transistor and the high concentration ion doping silicon layer are formed through injection of ions of the group-V elements. The p-typed thin film transistor is formed through injection of ions of group-III elements.

Generally, the n-type thin film transistor, the p-type thin film transistor, and the high concentration ion doping silicon layer are patterned along sensitive patterns formed through a mask. Particularly, several masks are required to form the n-type thin film transistor, the p-type thin film transistor, and the high concentration ion doping silicon layer on the array substrate.

Thus, as the number of the masks for manufacturing the array substrate is increased, cost for manufacturing the array substrate is increased.

SUMMARY OF THE INVENTION

Exemplary embodiments of the present invention provide an array substrate requiring fewer masks to be used during manufacturing.

Exemplary embodiments of the present invention also provide methods for manufacturing the array substrate.

An array substrate according to another exemplary embodiment of the present invention includes a base substrate, silicon patterns, a first insulating layer, gate metal patterns, a second insulating layer, data metal patterns, and a pixel electrode.

The base substrate includes a display region and a peripheral region. The peripheral region is formed in an outer area of the display region. The silicon patterns include a pixel pattern part, a storage pattern part, and a driving pattern part. The pixel pattern part is formed in the display region and has a first portion implanted with a first impurity at a high concentration and a second portion implanted with the first impurity at a low concentration. The storage pattern part is formed in the display region and implanted with the first impurity at a high concentration. The driving pattern part is implanted with the first impurity and a second impurity at a high concentration. The first insulating layer is formed on the base substrate to cover the silicon patterns. The gate metal patterns are formed on the first insulating layer. The second insulating layer is formed on the first insulating layer to cover the gate metal patterns. The data metal patterns are formed on the second insulating layer and electrically connected to the silicon patterns by a data contact hole formed in the first and second insulating layers. The pixel electrode is electrically connected to the data metal patterns.

A method of manufacturing an array substrate according to one exemplary embodiment of the present invention includes a step of forming silicon patterns, a step of implanting a first impurity at a high concentration, a step of forming gate metal patterns, a step of implanting a second impurity, a step of implanting the first impurity at a low concentration, and a step of forming a pixel electrode. In the step of forming silicon patterns, the silicon patterns are formed on a base substrate including a display region and a peripheral region. The peripheral region is formed in an outer area of the display region. In the step of implanting a first impurity at a high concentration, the silicon patterns include a pixel pattern part formed in the display region, a storage pattern part formed in the display region, and a driving pattern part formed in the peripheral region. The first impurity is respectively implanted into one portion of the pixel pattern part, storage pattern part, and driving pattern part. In the step of forming gate metal patterns, the gate metal patterns are formed on the silicon patterns. In the step of implanting a second impurity at a high concentration, the second impurity is implanted into one portion of the driving pattern part. In the step of implanting the first impurity at a low concentration, the first impurity is implanted into another portion of the pixel pattern part. In the step of forming a pixel electrode, the pixel electrode is to be connected to one portion of the pixel pattern part implanted with the first impurity at a high concentration. The first impurity may be an ion of the group V elements and the second impurity may be an ion of the group III elements.

According to an exemplary embodiment of the present invention, the first impurity may be simultaneously implanted into one portion of the pixel pattern part, the storage pattern part, and the driving pattern part. Therefore, the number of masks which are employed for implanting ions may be reduced and a cost of manufacturing may be reduced.

BRIEF DESCRIPTION OF THE DRAWINGS

The above and other features of the exemplary embodiments of the present invention will become readily apparent by reference to the following detailed description when considered in conjunction with the accompanying drawings wherein:

FIGS. 3A to 3C are cross-sectional views illustrating the array substrate shown in FIG. 2;

FIGS. 7A to 7C are cross-sectional views illustrating the array substrate shown in FIG. 6;

FIGS. 10A to 10C are cross-sectional views illustrating the array substrate shown in FIG. 8 for describing processes of implanting the first impurity at a low concentration;

FIGS. 12A to 12C are cross-sectional views illustrating the array substrate shown in FIG. 11.

DETAILED DESCRIPTION OF THE EXEMPLARY EMBODIMENTS

Figure 1:
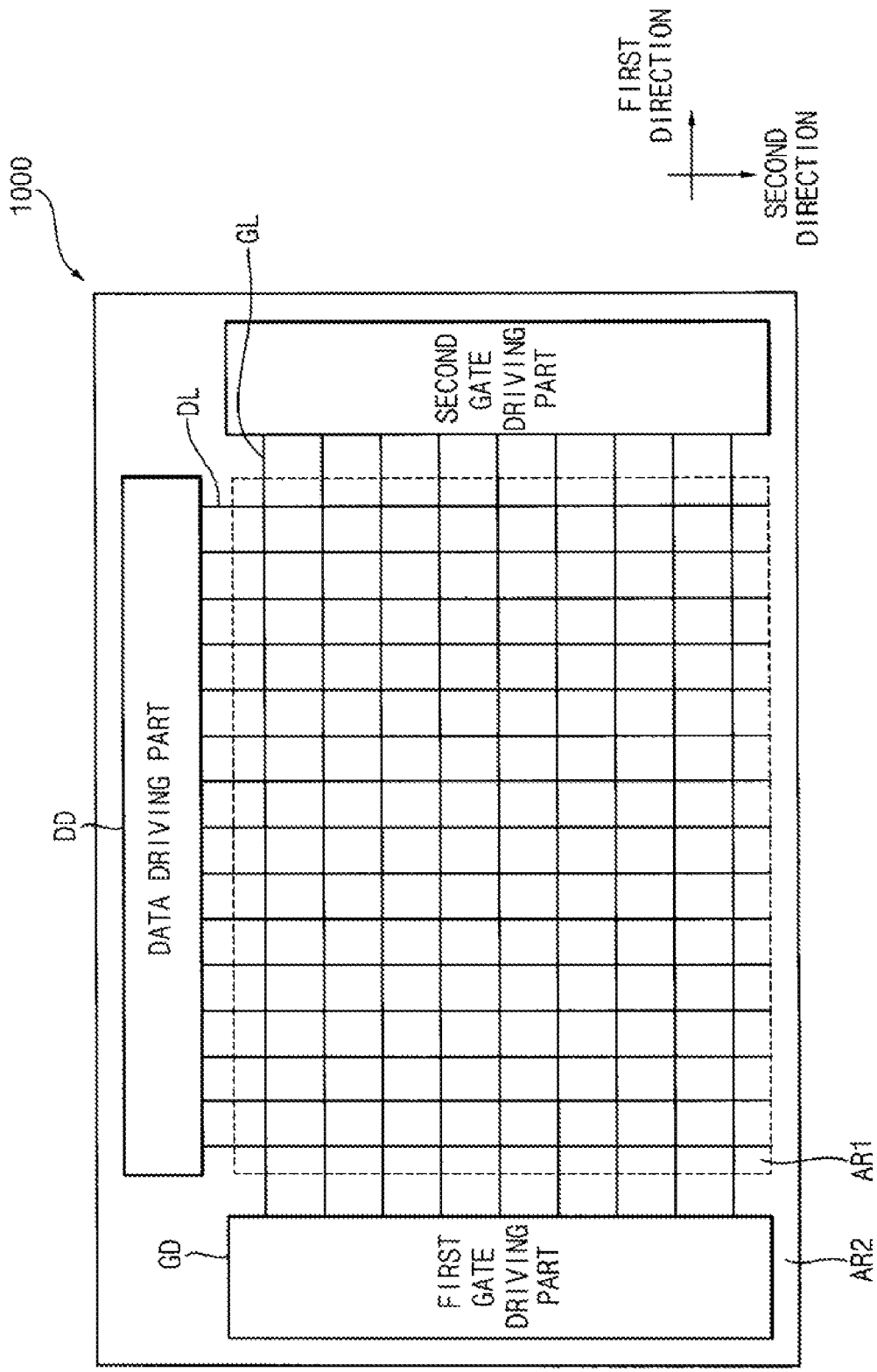
FIG. 1 is a plan view showing an array substrate according to an exemplary embodiment of the present invention.

Exemplary embodiments of the present invention are described more fully herein with reference to the accompanying drawings in which exemplar) embodiments of the present invention are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items. Hereinafter exemplary embodiments of the present invention will be described in detail with reference to the accompanied drawings.

FIG. 1 is a plan view illustrating an array substrate according to an exemplary embodiment of the present invention;

An array substrate 1000 according to an exemplary embodiment of the present invention is one component of a display panel. For example, the display panel includes the array substrate 1000, a color filter substrate (not shown) facing the array substrate 1000 and a liquid crystal layer inserted between the array substrate and the color filter substrate.

Referring to FIG. 1, the array substrate 1000 includes a plurality of gate lines GL, a plurality of data lines DL, a gate driving part GD and a data driving part DD.

Each of the gate lines GL is extended in a first direction and arranged in a second direction substantially perpendicular to the first direction. Each of the data lines DL is extended in the second direction and arranged in the first direction. The gate lines GL and the data lines DL form a plurality of unit pixels.

The gate driving part GD is electrically connected to the gate lines GL, and applies gate signals to the gate lines GL. The data driving part DD is electrically connected to the data lines DL and applies data signals to the data lines DL. The gate driving part GD may include two gate drivers formed to be electrically connected to opposite end portions of the gate line GD or one gate driver formed to be electrically connected to one end portion of the gate line GD.

The array substrate 1000 includes a display region AR1 for displaying an image and a peripheral region AR2 formed in an outer area of the display region AR1. For example, a plurality of unit pixels is formed in the display region AP1. The gate driving part GD and the data driving part DD are formed in the peripheral region AR2.

Each unit pixel includes a pixel thin film transistor and a pixel electrode electrically connected to the pixel thin film transistor. The pixel thin film transistor includes a pixel gate electrode, a pixel source electrode, a pixel drain electrode, and a pixel pattern part. For example, the pixel thin film transistor is an n-typed thin film transistor implanted with ions of group V elements.

On the other hand, the gate driving part GD and/or the data driving part DD each include a driving circuit. The driving circuit includes a plurality of driving thin film transistors. The driving thin film transistor includes a driving gate electrode, a driving source electrode, a driving drain electrode and a driving pattern part. For example, the driving circuit is composed of a complementary metal-oxide semi-conductor (CMOS) circuit. Therefore, the driving thin film transistor includes an n-type transistor implanted with the ions of the group V elements and a p-type transistor implanted with ions of group III elements.

Figure 2:
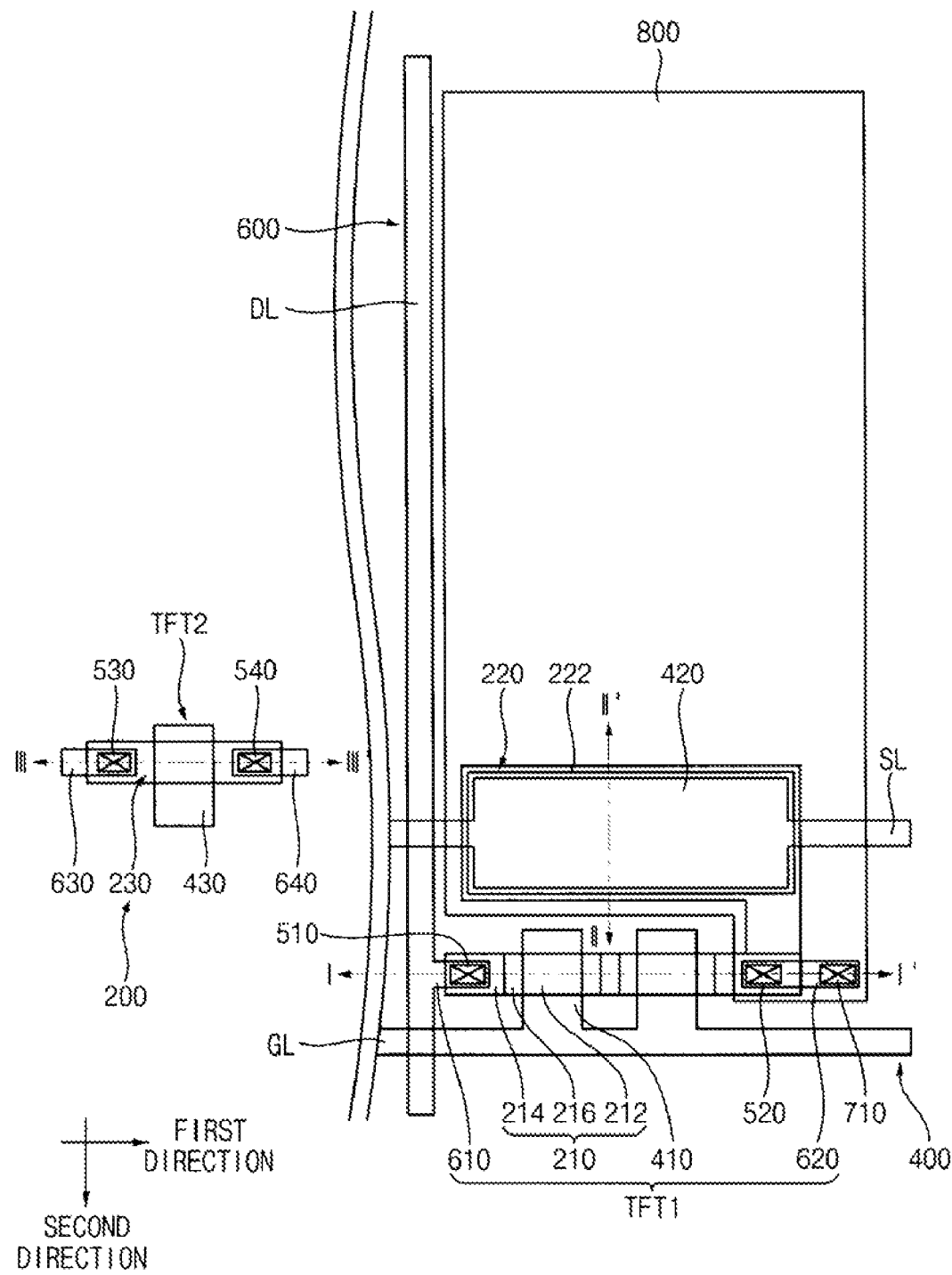
FIG. 2 is an enlarged plan view illustrating the array substrate shown in FIG. 1.
Figure 3B:
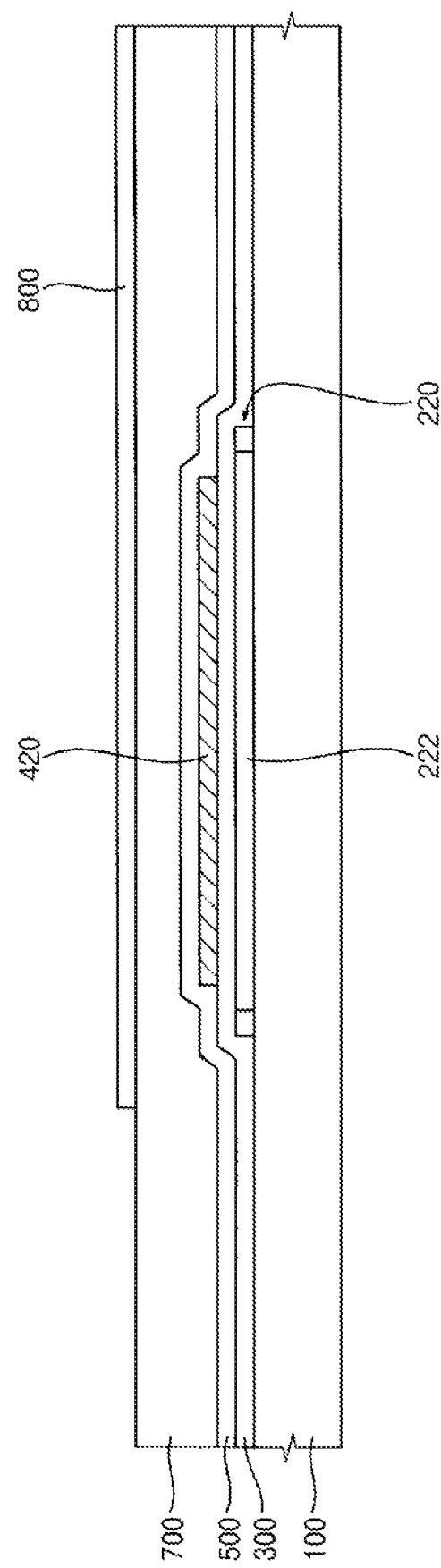

FIG. 2 is an enlarged plan view illustrating the array substrate shown in FIG. 1. FIGS. 3A to 3C are cross-sectional views illustrating the array substrate shown in FIG. 2. In detail, FIG. 3A is a cross-sectional view taken along a line of I-I' shown in FIG. 2. FIG. 3B is a cross-sectional view taken along a line of II-II' shown in FIG. 2. FIG. 3C is a cross-sectional view taken along a line of III-III' shown in FIG. 2.

Referring to FIGS. 1 to 3C, the arrays substrate 1000, according to the exemplary embodiment of the present invention shown in FIG. 1, includes a base substrate 100, silicon patterns 200, a first insulating layer 300, gate metal patterns 400, a second insulating layer 500, data metal patterns 600, a third insulating layer 700, and pixel electrodes 800.

The base substrate 100 is substantially plate shaped and comprises a transparent material, such as glass, quartz, synthetic resins, etc. The base substrate 100 includes the display region AR1 for displaying in image and the peripheral region AR2 formed in an outer area of the display region AR1.

The silicon patterns 200 are formed on the base substrate 100. For example, the silicon patterns 200 comprise a poly silicon material having high conductivity. The silicon patterns 200 include a pixel pattern part 210, a storage pattern part 220, and a driving pattern part 230.

The pixel pattern part 210 is one component of the pixel thin film transistor TFT1. The pixel pattern part 210 is formed in the display region AR1 of the base substrate 100. The pixel pattern part 210 is extended in the first direction. The pixel pattern part 210 includes a pixel channel part 212, a pixel high concentration doping part 214, and a pixel low concentration doping part 216.

The pixel channel part 212 is formed with a poly silicon material that is not implanted with the first impurity. The pixel high concentration doping part 214 is formed in opposite end portions of the pixel channel part 212. The pixel high concentration doping part 214 is formed with a poly silicon material that is implanted with the first impurity at the high concentration. The pixel low concentration doping part 216 is formed between the pixel channel part 212 and the pixel high concentration doping part 214. The pixel low concentration doping part 216 is formed with a poly silicon material that is implanted with the first impurity at a low concentration. For example, the first impurity is the ions of the group V elements.

For example, the pixel pattern part 210 includes two pixel channel parts 212. For example, the pixel channel parts 212 are spaced apart from each other. The pixel low concentration doping part 216 and the pixel high concentration doping part 214 are formed in opposite end portions of each pixel channel parts 212, respectively. Alternatively, the pixel pattern part 210 may include one pixel channel part.

The storage pattern part 220 is formed in the display region AR1 of the base substrate 110. The storage pattern part 220 is spaced apart from the pixel pattern part 210. Alternatively, the storage pattern part 220 may make contact with the pixel pattern part 210.

The storage pattern part 220 includes the storage high concentration doping part 222. The storage high concentration doping part 222 is formed with a poly silicon material that is implanted with the first impurity at a high concentration.

The driving pattern part 230 is one component of a driving thin film transistor TFT2. The driving pattern part 230 is formed in the peripheral region AR2 of the base substrate 100. The driving pattern part 230 includes a driving channel part 232 and a driving high concentration doping part 234.

The driving channel part 232 is formed with a poly silicon material that is implanted with the first and second impurities. For example, the second impurity is ions of group III elements.

The driving high concentration doping part 234 is formed in opposite end portions of the driving channel part 232. The driving high concentration doping part 234 is formed with a poly silicon material that is implanted with the second impurity at the high concentration.

When the driving high concentration doping part 234 is formed using the poly silicon material implanted with ions of group V elements at the high concentration, the driving thin film transistor is an n-type transistor. When the driving high concentration doping part 234 is formed using the poly silicon material implanted with ions of group III elements at the high concentration, the driving thin film transistor is a p-type transistor.

The first insulating layer 300 is formed on the base substrate 100 to cover the silicon patterns 200. Examples of an insulating material that can be used for the first insulating layer 300 include silicon nitride ($SiN_x$), silicon oxide ($SiO_x$), etc.

The gate metal patterns 400 are formed on the first insulating layer 300. The gate metal patterns 400 include a gate line GL, a storage line SL, a pixel gate electrode 410, a storage electrode 420, and a driving gate electrode 430.

The gate line GL is extended in a first direction. The storage line SL is spaced apart from the gate line GL and extended in the first direction.

The pixel gate electrode 410 is one component of the pixel thin film transistor TFT1. The pixel gate electrode 410 is extended from the gate line and extends in the second direction. The pixel gate electrode 410 is formed in a position corresponding to the pixel channel part 212. For example, the number of the pixel gate electrodes 410 is substantially the same as the number of the pixel channel part 212. For example, two pixel channel parts 212 may be formed and two pixel electrodes may also be formed.

The storage electrode 420 is electrically connected to the storage line SL. The storage electrode 420 is formed in a position corresponding to the storage high concentration doping part 222. The storage electrode 420 and the storage high concentration doping part 222 are spaced apart from each other, and the first insulating layer is disposed between the storage electrode 420 and the storage high concentration doping part 222. Therefore, the storage electrode 420, the storage high concentration doping part 222 and the first insulating layer 300 form a stabilized capacitor.

The driving gate electrode 430 is one component of the driving thin film transistor TFT2. The driving gate electrode 430 is formed in a position corresponding to the driving channel part 232 formed in the peripheral region AR2.

The second insulating layer 500 is formed on the first insulating layer 300 to cover the gate metal patterns 400. Examples of an insulating material that can be used for the second insulating layer 500 include silicon nitride ($SiN_x$), silicon oxide ($SiO_x$), etc.

The first and second insulating layers 300 and 500 respectively include a first contact hole 510, a second contact hole 520, a third contact hole 530 and a fourth contact hole 540.

Data metal patterns 600 are formed in the second insulating layer 500. The data metal patterns 600 include a data line DL, a pixel source electrode 610, a pixel drain electrode 620, a driving source electrode 630 and a driving drain electrode 640. For example, the pixel source electrode 610 and the pixel drain electrode 620, which are components of the pixel thin film transistor TFT1, are formed in the display region AR1. The driving source electrode 630 and the driving drain electrode 640, which are components of the driving thin film transistor TFT2, are formed in the peripheral region AR2.

The data lines DL are extended in the second direction to cross the gate lines GL. The data lines DL and the gate lines GL, which cross each other, form a plurality of unit pixels.

The pixel source electrode 610 is extended in the first direction to be overlapped with a first portion of the pixel high concentration doping part 214. The pixel source electrode 610 is electrically connected to the pixel high concentration doping part 214 by the first contact hole 510 formed in a first upper position of the pixel high concentration doping part 214.

The pixel drain electrode 620 is spaced apart from the pixel source electrode 610. The pixel drain electrode 620 overlaps a second portion of the pixel high concentration doping part 214. The pixel drain electrode 620 is electrically connected to the second portion of the pixel high concentration doping part 214 by the second contact hole 520 formed in a second upper position of the pixel high concentration doping part 214.

The driving source electrode 630 overlaps a first portion of the driving high concentration doping part 234. The driving source electrode 630 is electrically connected to the first portion of the driving high concentration doping part 234 by the third contact hole 530 formed in a first upper position of the driving high concentration doping part 234.

The driving drain electrode 640 is spaced apart from the driving source electrode 630. The driving drain electrode 640 overlaps a second portion of the driving high concentration doping part 234. The driving drain electrode 640 is electrically connected to the second portion of the driving high concentration doping part 234 by the fourth contact hole 540 formed in a second upper position of the driving high concentration doping part 234.

The third insulating layer 700 is formed on the second insulating layer 500 to cover the data metal patterns 600. For example, the third insulating layer 700 is an organic insulating layer. The third insulating layer 700 includes a pixel contact hole 710.

The pixel electrode 800 is formed in each unit pixel formed on the third insulating layer 700. The pixel electrode 800 is electrically connected to the pixel drain electrode 620 by the pixel contact hole formed in an upper position of the pixel drain electrode 620.

Examples of a transparent conductive material that can be used for the pixel electrode 800 include indium tin oxide (ITO), indium zinc oxide (IZO), amorphous indium tin oxide (a-ITO), etc.

A method for manufacturing the array substrate 1000 shown in FIGS. 2 to 3C is described below.

Figure 4:
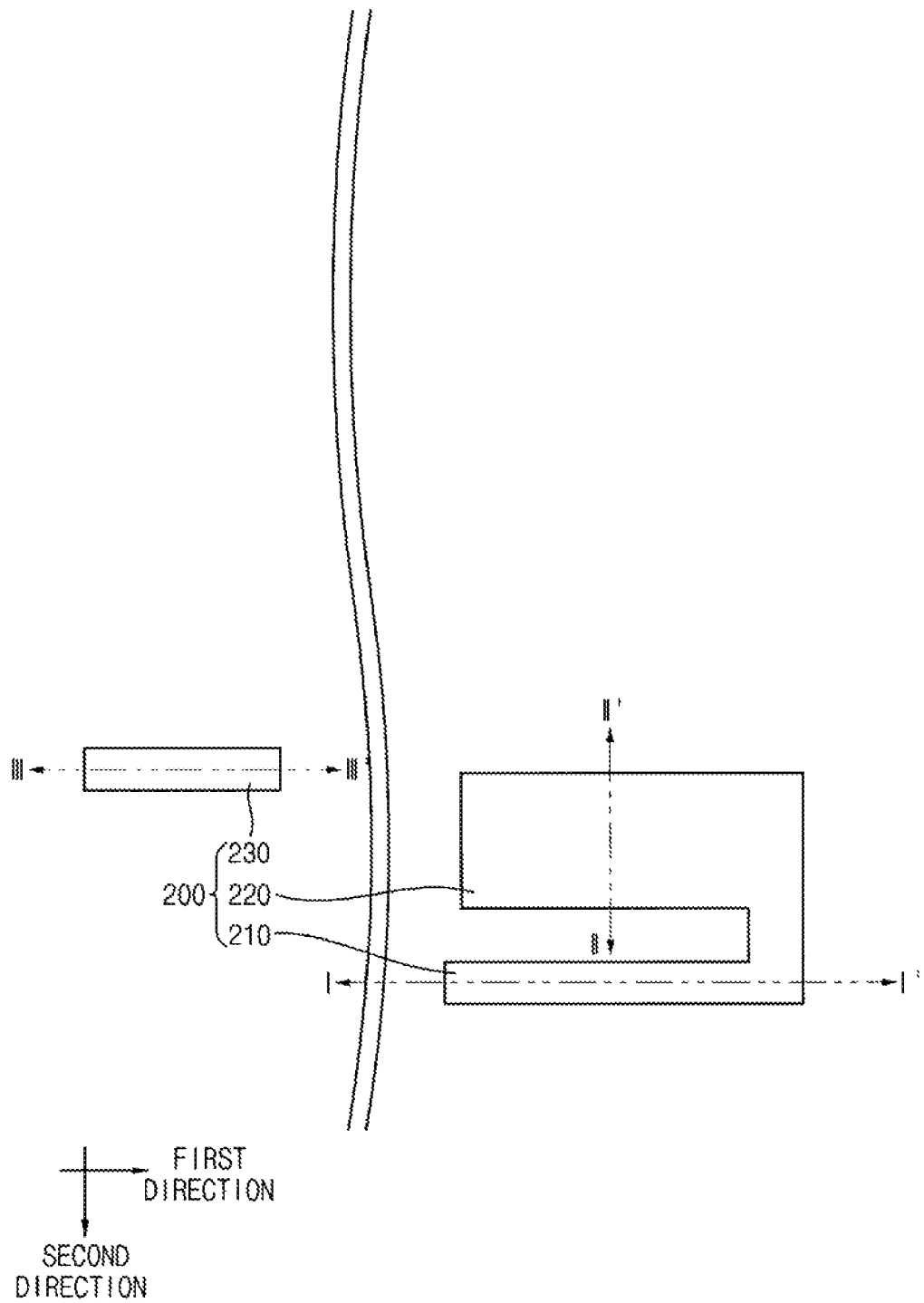
FIG. 4 is a plan view illustrating a process of forming silicon patterns for a method of manufacturing an array substrate according to an exemplary embodiment of the present invention.
Figure 5A:
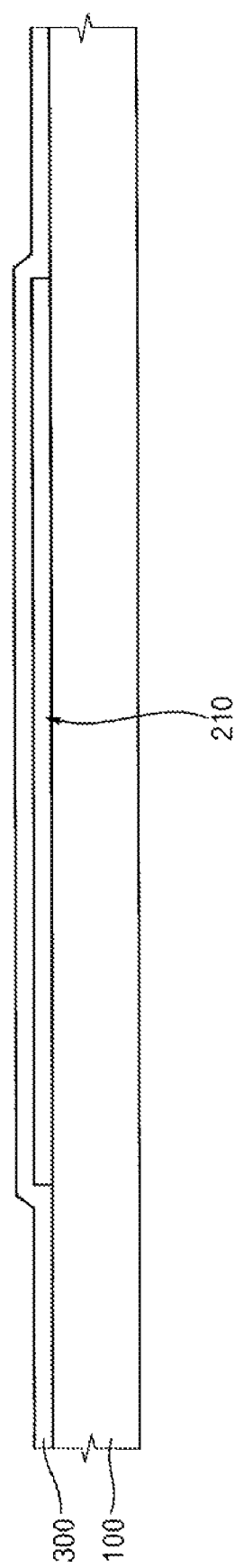
FIGS. 5A to 5C are cross-sectional views of the array substrate shown in FIG. 4.
Figure 5B:
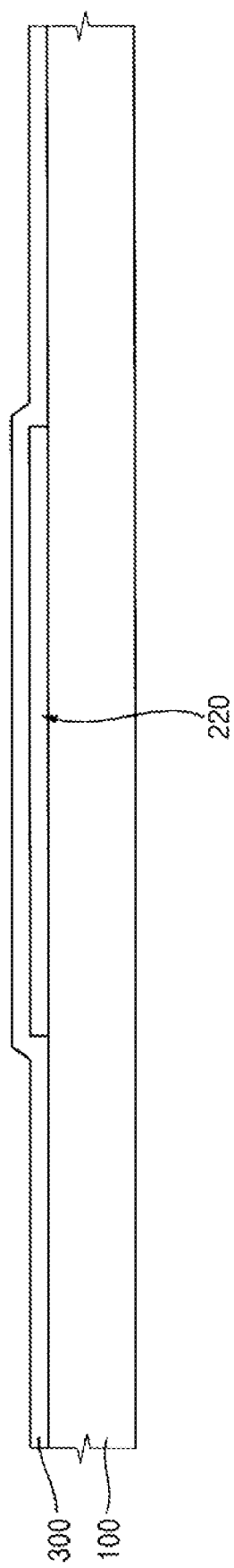
Figure 5C:
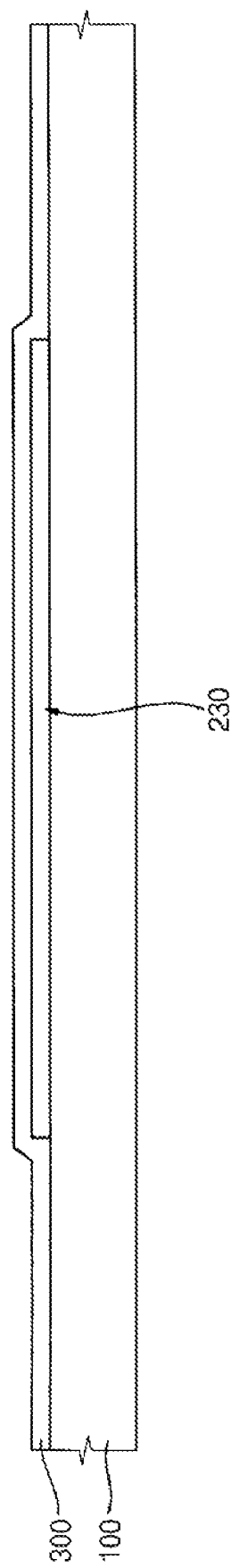

FIG. 4 is a plan view illustrating a process for forming silicon patterns according to a method of manufacturing an array substrate according to an exemplary embodiment of the present invention. FIGS. 5A to 5C are cross-sectional views illustrating the array substrate shown in FIG. 4. In detail, FIG. 5A is a cross-sectional view taken along line I-I' shown in FIG. 4. FIG. 5B is a cross-sectional view taken along line II-II' shown in FIG. 4. FIG. 5C is a cross-sectional view taken along line III-III' shown in FIG. 4.

Referring to FIGS. 4, 5A, 5B and 5C, silicon patterns are formed on the base substrate 100.

For example, the base substrate 100 includes a display region AR1 for displaying an image and a peripheral region AR2 formed in an outer area of the display region. A silicon layer is formed in a front surface of the base substrate 100. The silicon layer is etched and the silicon patterns are formed on the base substrate 100. For example, the silicon layer is formed with a poly silicon material crystallized by heat treatment using a laser beam.

The silicon patterns 200 include a pixel pattern part 210, a storage pattern part 220 and a driving pattern part 230 formed in the peripheral region AR2. The pixel pattern part 210 and the storage pattern part 220 are formed in the display region AR1.

The pixel pattern part 210 is extended in the first direction. The storage pattern part 220 is spaced apart from the pixel pattern part 210. Alternatively, as shown in FIGS. 4 to 5C, the storage pattern part 220 may make contact with the pixel pattern part 210.

A first insulating layer 300 is formed on the base substrate 100 to cover the pixel pattern part 210. Examples of an insulating material that can be used for the first insulating layer 300 include silicon nitride ($SiN_x$), silicon oxide ($SiO_x$), etc.

Figure 6:
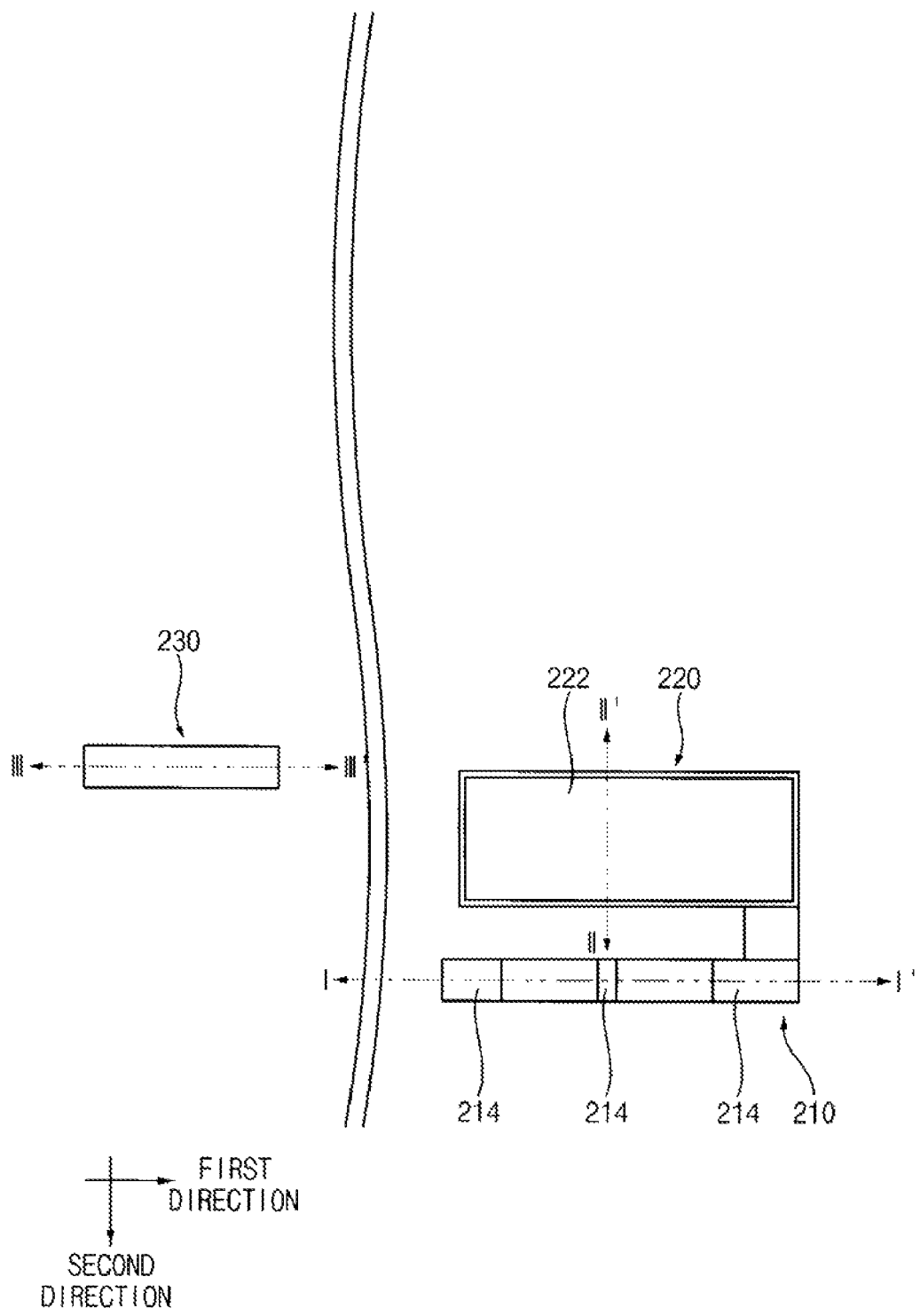
FIG. 6 is a plan view illustrating a process of implanting a first impurity for a method of manufacturing an array substrate according to an exemplary embodiment of the present invention.
Figure 7C:
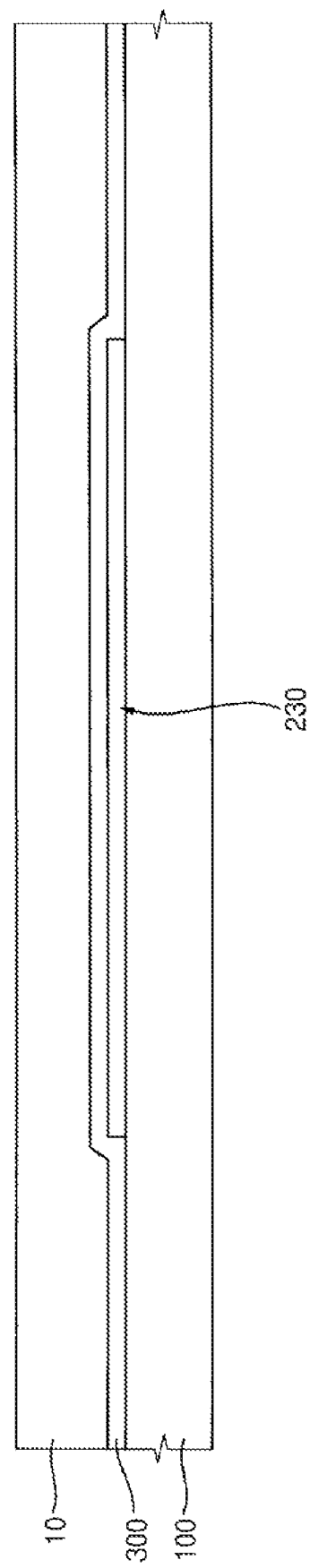

FIG. 6 is a plan view illustrating a process for implanting a first impurity for manufacturing an array substrate according to an exemplary embodiment of the present invention. FIGS. 7A to 7C are cross-sectional views illustrating the array substrate shown in FIG. 6.

Referring to FIGS. 6, 7A, 7B and 7C, after the first insulating layer 300 is formed on the base substrate 100, photosensitive patterns 10 are formed on the first insulating layer 300. The first photosensitive patterns 10 are formed through a process of exposure. The process of exposure is a process for exposing a first photosensitive layer by ultraviolet light through a photo mask that is disposed on the first photosensitive layer.

For example, the first photosensitive patterns 10 have a first opening portion that partially exposes the pixel pattern part 210 and a second opening portion that partially exposes the storage pattern part 220. Alternatively, the first photosensitive patterns may completely cover the driving pattern part 230 or partially expose the driving pattern part 230. In FIG. 7C, the first photosensitive patterns 10 completely cover the driving pattern part 230.

The first impurity is subsequently implanted into the silicon patterns 200 at a high concentration by the first of the photosensitive patterns 10. For example, the first impurity comprises ions of group-V elements.

For example, the first impurity is implanted into a first portion of the pixel pattern part 210 to form the pixel high concentration doping part 214. The first impurity is implanted into the first portion of the storage pattern part 220 to form the storage pattern part 220.

Also, the first impurity is implanted into a first portion of the driving pattern part 230 and the driving high concentration doping part 234 is consequently formed. The first impurity is not implanted into a second portion of the driving pattern part 230. The driving high concentration doping part 234 is one component of an n-type thin film transistor.

Figure 8:
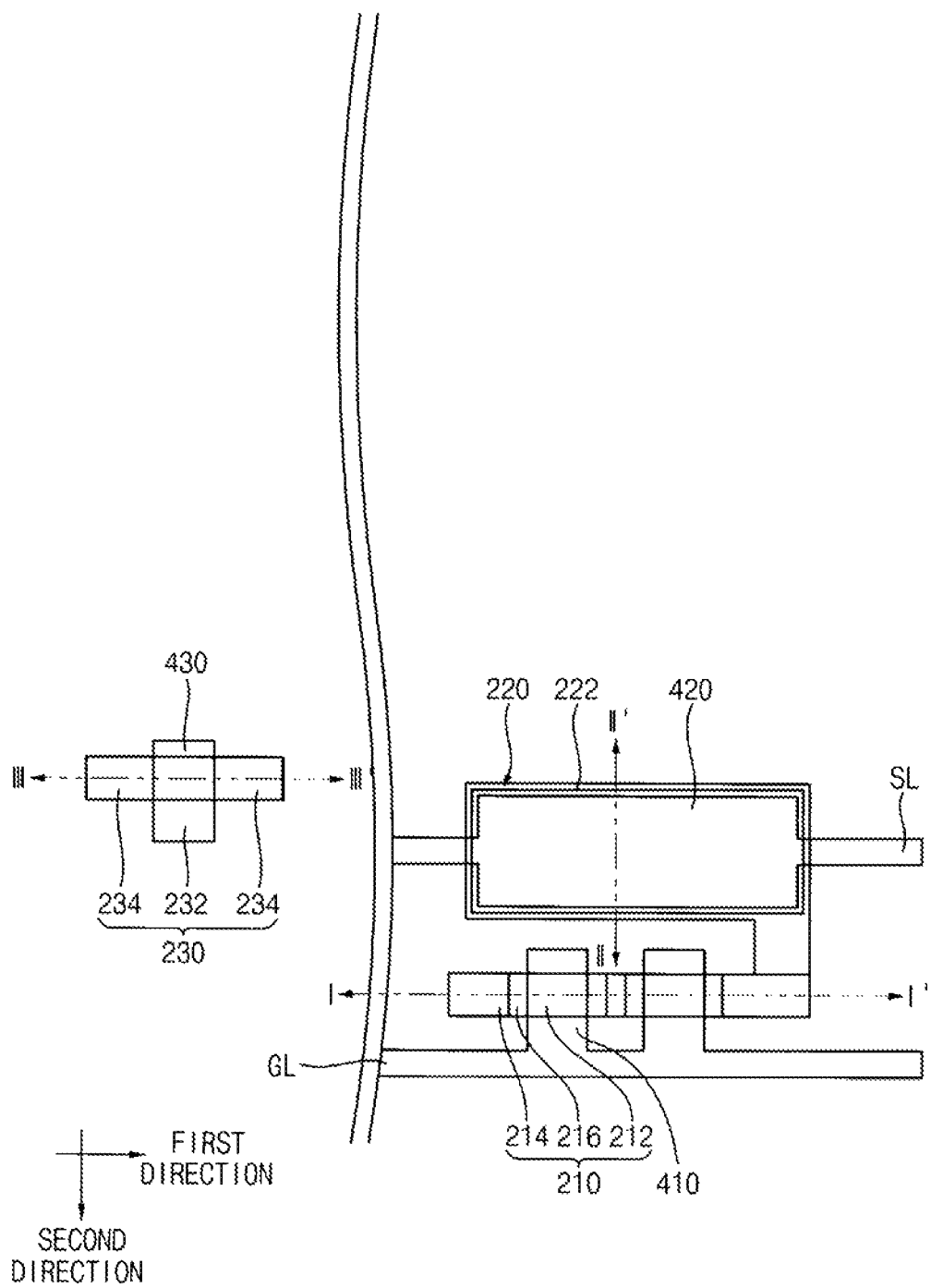
FIG. 8 is a plan view illustrating a process of implanting a second impurity at a high concentration and a first impurity at a low concentration for a method of manufacturing an array substrate according to an embodiment of the present invention.
Figure 9A:
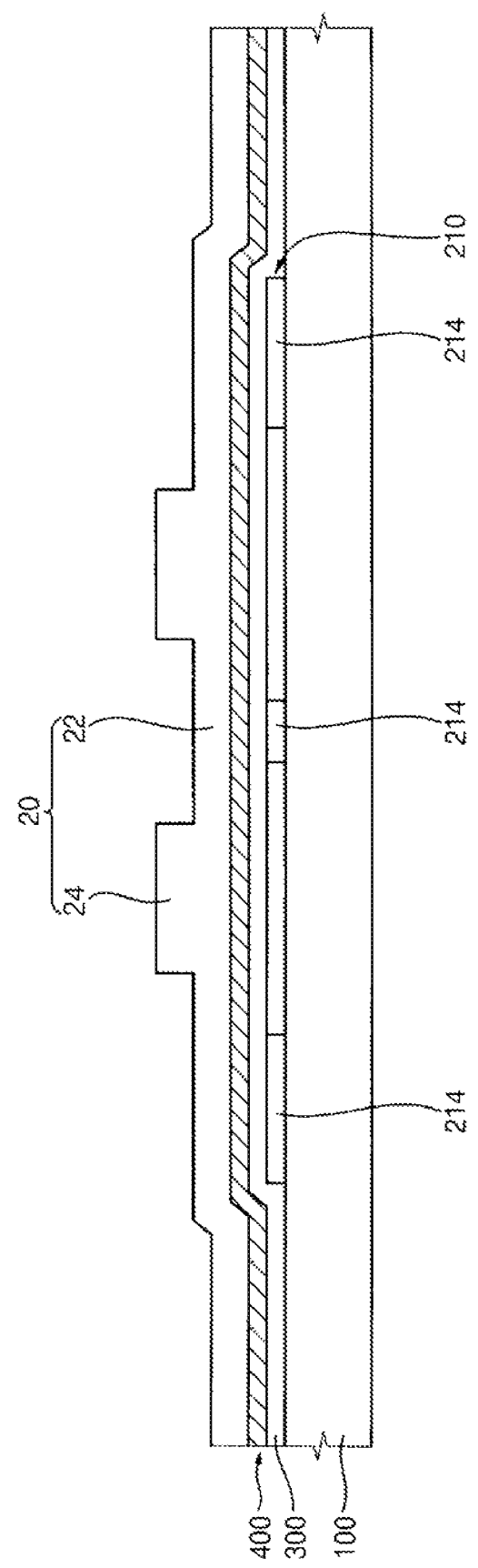
FIGS. 9A to 9C are cross-sectional views illustrating the array substrate shows in FIG. 8 for describing processes of implanting the second impurity at a high concentration.
Figure 9B:
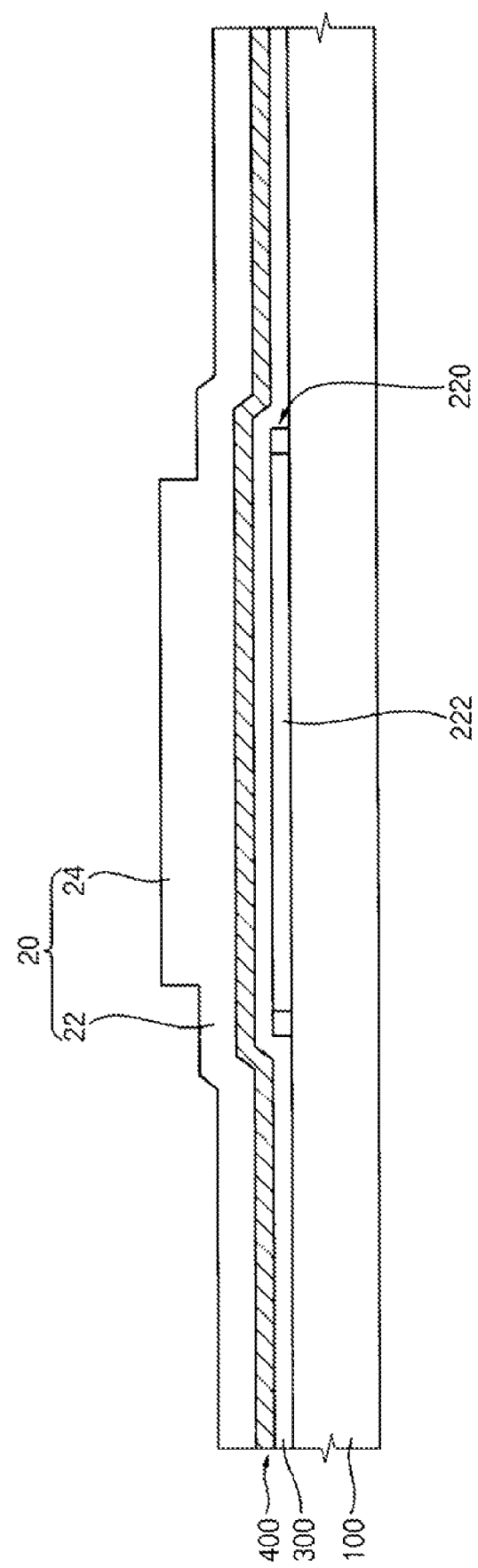
Figure 9C:
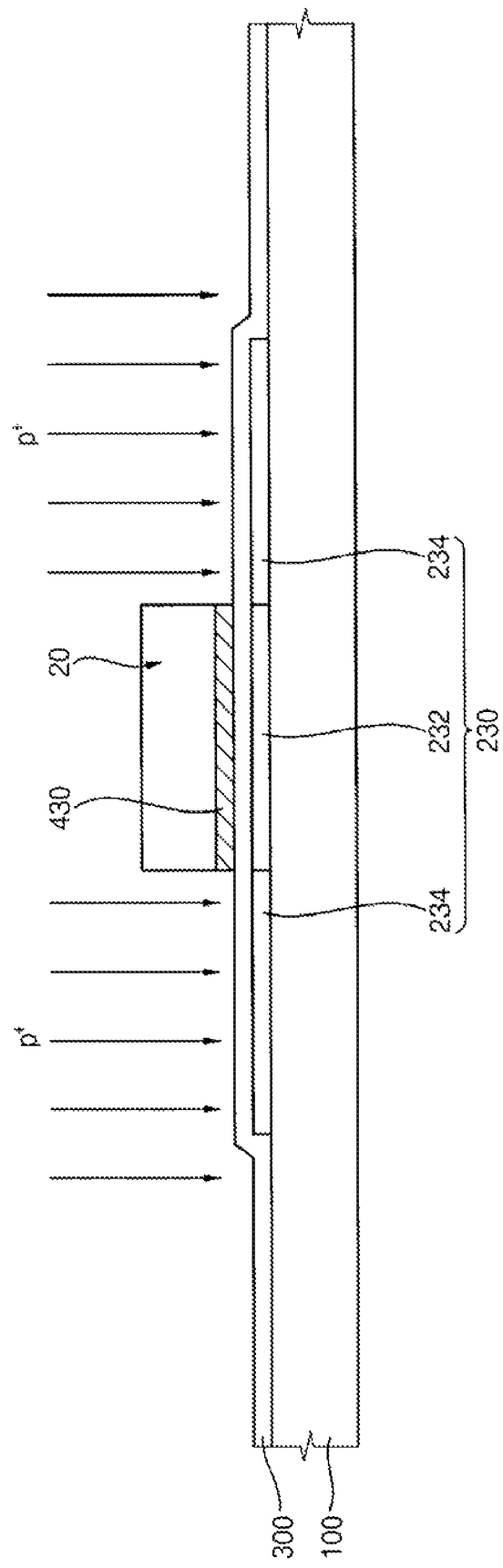
Figure 10B:
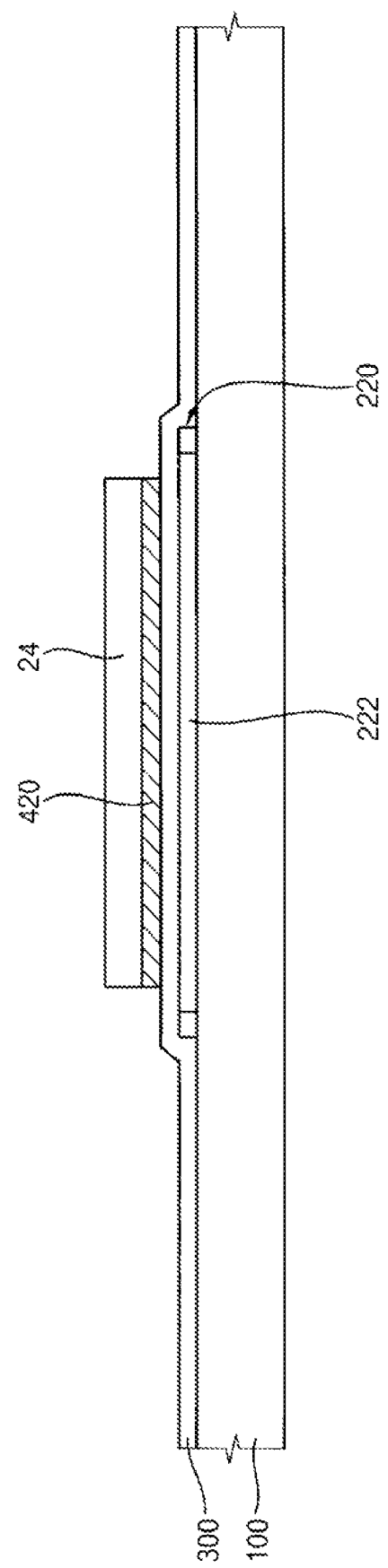
Figure 10C:
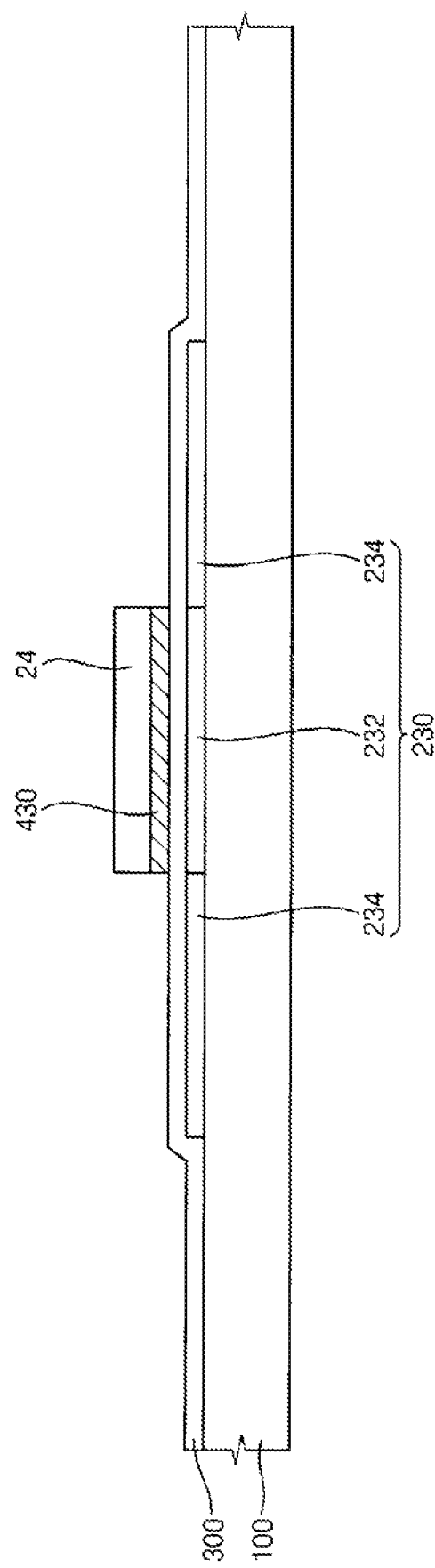

FIG. 8 is a plan view illustrating a process for implanting a second impurity at a high concentration and a first impurity at a low concentration according to a method of manufacturing in array substrate according to an embodiment of the present invention. FIGS. 9A to 9C are cross-sectional views of the array substrate shown in FIG. 8 for illustrating processes of implanting the second impurity at a high concentration. FIGS. 10A to 10C are cross-sectional views of the array substrate shown in FIG. 8 for illustrating processes of implanting the first impurity at a low concentration. In detail, FIGS. 9A and 10A are cross-sectional views taken along a line I-I' shown in FIG. 8. FIGS. 9B and 10B are cross-sectional views taken along a line II-II' shown in FIG. 8. FIGS. 9C and 10C are cross-sectional views taken along a line III-III' shown in FIG. 8.

Referring to FIGS. 8, 9A, 9B and 9C, after the first of the photosensitive patterns 10 are removed, a gate metal layer is formed on the first insulating layer 300 and the second photosensitive patterns 20 are subsequently formed on the gate metal layer.

The second photosensitive patterns 20 include a first sub-sensitive layer 22 and a second sub-sensitive layer 24. The first sub-sensitive layer 22 is formed on the gate metal layer and has substantially the same shape as the gate metal patterns 400 when viewed on a plane. The second sub-sensitive layer 24 is formed on the first sub-sensitive layer 22 and has a different shape from the first sub-sensitive layer 22.

The gate metal layer is partially etched to form the gate metal patterns 400. For example, the gate metal patterns 400 are formed by using the first sub-sensitive layer 22 of the second photosensitive patterns 20 as an etching mask. The driving gate electrode 430 is formed on the peripheral region AR2 to partially overlap the driving channel part 232.

The gate lines GL and the driving pattern part 230 may be simultaneously formed. Alternatively, the gate lines GL may be formed after the driving pattern part 230 has been formed.

After the gate metal patterns 400 are formed, the second impurity is implanted into one portion of the driving pattern part 230 at a high concentration through the first sub-sensitive layer 22. The driving high concentration doping part 234 is consequently formed in the driving pattern part 230. For example, the second impurity includes ions of group-III elements. The driving high concentration doping part 234 implanted with the second impurity is a component of a p-type thin film transistor.

Referring to FIGS. 10A, 10B and 10C, after the second impurity is implanted into the driving high concentration doping part 234 at the high concentration, the first sub-sensitive layer 22 of the second photosensitive patterns 20 is removed. For example, the first sub-sensitive layer 22 is removed through a process of etch back and the second sub-sensitive layer 24 consequently remains.

The gate metal patterns 400 are partially etched using the second sub-sensitive layer 24 as an etching mask. The gate metal patterns 400 includes a gate line GL, a storage line SL, a pixel gate electrode 410 and a storage electrode 420.

For example, the gate line GL is extended in the first direction. The storage line SL is spaced apart from the gate line GL and extended in the first direction. The pixel gate electrode 410 is projected from the gate line GL toward the second direction, and overlaps one portion of the pixel pattern part 210. For example, there may be two pixel gate electrodes 410. The storage electrode 420 is electrically connected to the storage line SL and is formed in a position corresponding to the storage high concentration doping part 222.

The first impurity is implanted into the pixel pattern part 210 at a low concentration by the second sub-sensitive layer 24. The pixel low concentration doping part 216 is formed in the pixel pattern part 210, and the pixel channel part 212 is defined.

For example, the pixel channel part 212, which is not implanted with the first impurity, is formed in a lower position of the pixel gate electrode 410. The pixel low concentration doping part 216 is formed between the pixel channel part 212 and the pixel high concentration doping part 214. For example, a poly silicon part is implanted with the first impurity at the low concentration to form the pixel low concentration doping part 216.

The second sub-sensitive layer 24 is removed after the first impurity is implanted at the low concentration. The pixel thin film transistor TFT1 and the stabilized capacitor are formed in the display region AR1 of the base substrate 100, and the driving thin film transistor TFT2 is formed in the peripheral region AR2 of the base substrate 100. The pixel thin film transistor TFT1 includes an n-type thin film transistor and the driving thin film transistor TFT2 includes p-type and n-type thin film transistors. For example, the peripheral region AR2 includes a circuit including the n-type thin film transistor and a circuit including the p-type thin film transistor.

Figure 11:
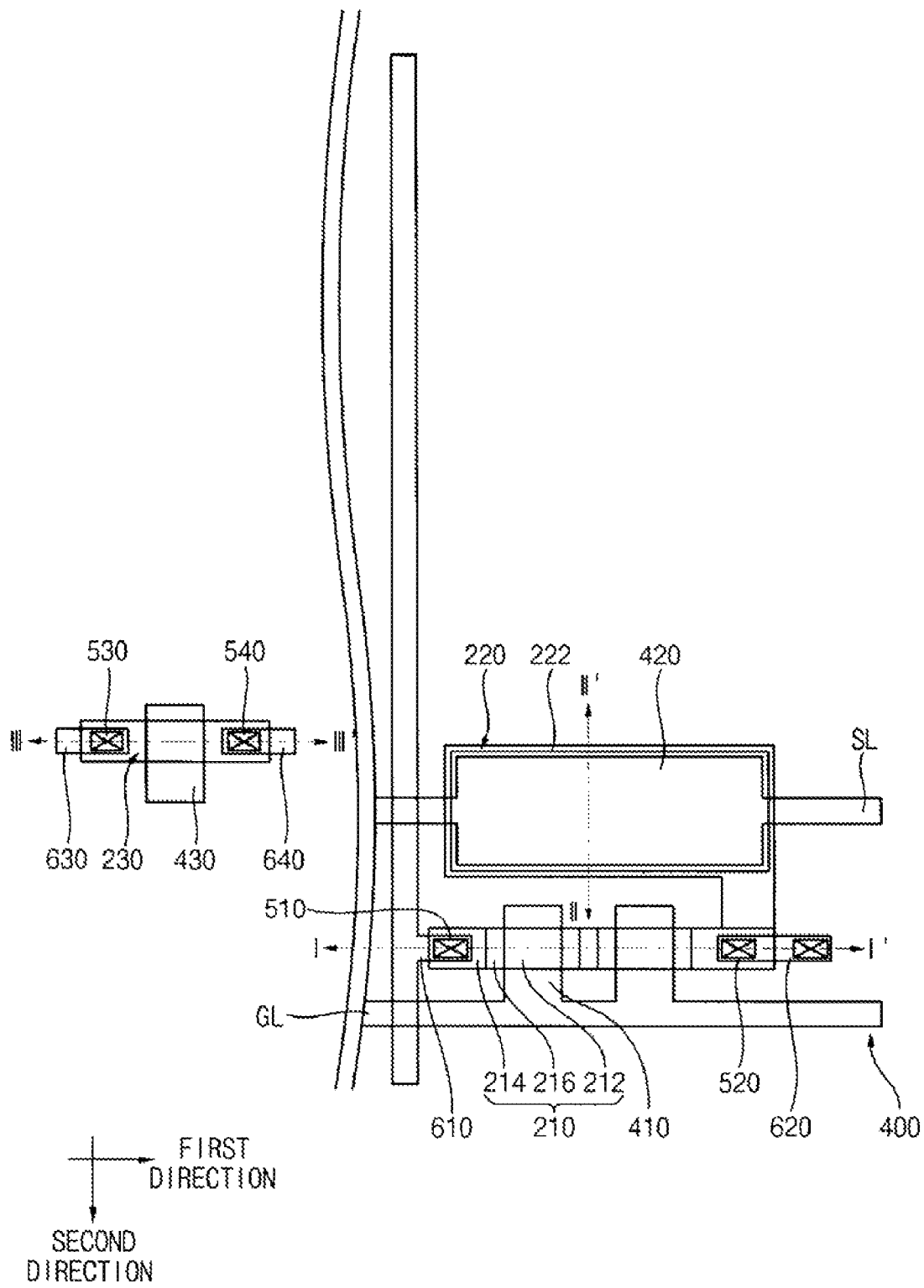
FIG. 11 is a plan view illustrating a process of forming data metal patterns for a method of manufacturing an array substrate according to an exemplary embodiment of the present invention.
Figure 12B:
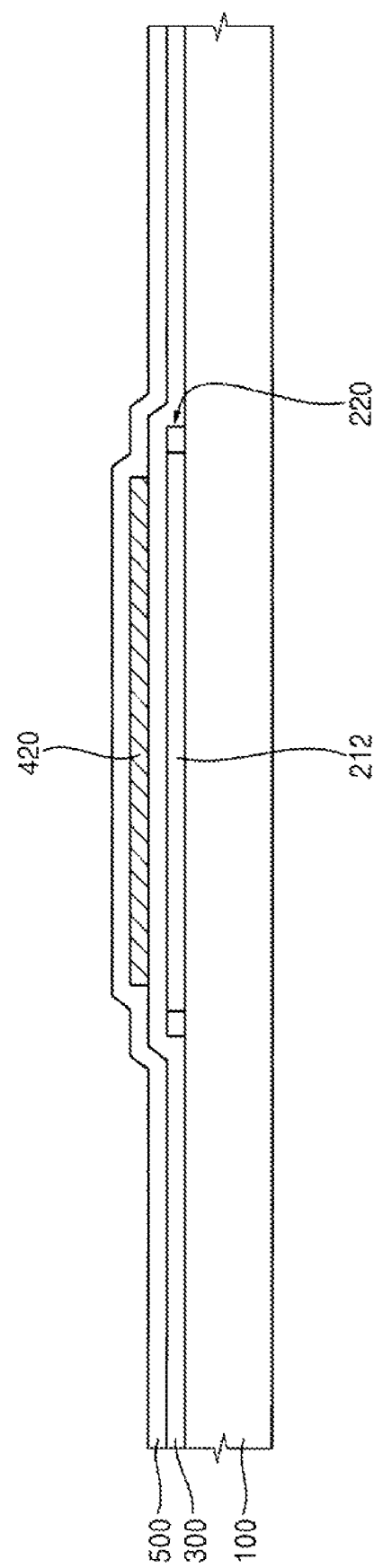
Figure 12C:
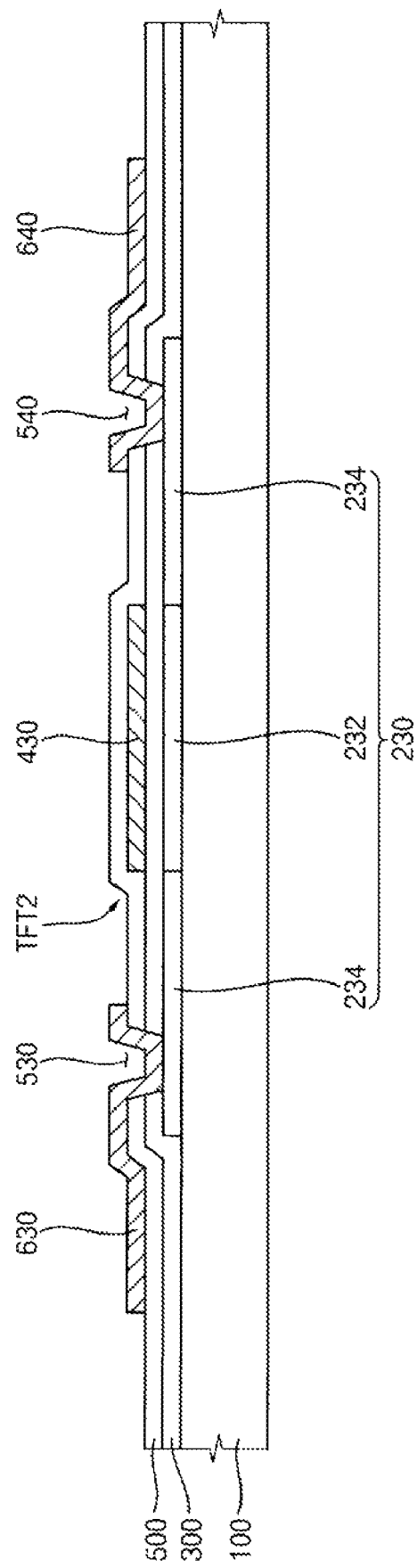

FIG. 11 is a plan view illustrating a process of forming data metal patterns for manufacturing an array substrate according to an exemplary embodiment of the present invention. FIGS. 12A to 12C are cross-sectional views illustrating the array substrate shown in FIG. 11, in detail, FIG. 12A is a cross-sectional view taken along a line of I-I' shown in FIG. 11. FIG. 12B is a cross-sectional view taken along a line of II-II' shown in FIG. 11. FIG. 12C is a cross-sectional view taken along a line of III-III' shown in FIG. 11.

Referring to FIGS. 11, 12A, 12B, and 12C, the second insulating layer 500 is formed to cover the gate metal patterns 400 after the second sub-sensitive layer 24 is removed. Examples of an insulating material that can be used for the second insulating layer 400 include silicon nitride ($SiN_x$), silicon oxide ($SiO_x$), etc.

The first and second insulating layers 300 and 400 are simultaneously etched to form the first contact hole 510, the second contact hole 520, the third contact hole 530, and the fourth contact hole 540. The first contact hole 510 is formed on a first portion of the pixel high concentration doping part 214. The second contact hole 520 is formed on a second portion of the pixel high concentration doping part 214. The third contact hole 530 is formed on a first portion of the driving high concentration doping part 234. The fourth contact hole 540 is formed on a second portion of the driving high concentration doping part 214.

The data metal patterns 600 are formed on the second insulating layer 500. The data metal patterns 600 are electrically connected to a first portion of the silicon patterns 200 by the first contact hole 510, the second contact hole 520, the third contact hole 530 and the fourth contact hole 540. The data metal layer, which is formed on a front surface of the second insulating layer 500, is patterned to form the data metal patterns 600.

The data metal patterns 600 include a data lines DL, a pixel source electrode 610, a pixel drain electrode 620, a driving source electrode 630 and a driving drain electrode 640. The pixel source electrode 610 and the pixel drain electrode 620 are components of the pixel thin film transistor TFT1. The pixel source electrode 610 and the pixel drain electrode 620 are formed in the display region AR1. The driving source electrode 630 and the driving drain electrode 640 are components of the drain thin film transistor TFT2. The driving source electrode 630 and the driving drain electrode 640 are formed in the peripheral region AR2.

The data line DL is extended in the second direction to cross the gate line GL. The pixel source electrode 610 is extended from the data line DL along the first direction to overlap the first portion of the pixel high concentration doping part 214, and is electrically connected to the first portion of the pixel high concentration doping part 214 by the first contact hole 510. The pixel drain electrode 620 is spaced apart from the pixel source electrode 610 and overlaps the second portion of the pixel high concentration doping part 214. Also, the pixel drain electrode 620 is electrically connected to the second portion of the pixel high concentration doping part 214 by the second contact hole 520.

The driving source electrode 630 partially overlaps the driving high concentration doping part 234 and is electrically connected to the first portion of the driving high concentration doping part 234 by the third contact hole 530. The driving drain electrode 640 is spaced apart from the driving source electrode 630. Also, the driving drain electrode 640 partially overlaps the driving high concentration doping part 234 and is electrically connected to the second portion of the driving high concentration doping part 234.

Referring to FIGS. 2, 3A, 3B, and 3C, the third insulating layer is formed on the second insulating layer to cover the data metal patterns 600 after the data metal patterns 600 are formed. For example, the third insulating layer is an organic insulating layer.

The pixel contact hole 710 is formed in the third insulating layer 700. The pixel contact hole 710 is formed in an upper position of the pixel drain electrode 620 to expose the pixel drain electrode 620.

The pixel electrode 800 is formed on the third insulating layer 700. The pixel electrode 700 is electrically connected to the pixel drain electrode 620 by the pixel contact hole 710. A transparent metal layer formed in a front surface of the third insulating layer 700 is patterned to form the pixel electrode 800 on the third insulating layer 700.

Alternatively, processes of patterning and implanting impurity may be performed using a plurality of masks. However, when the processes of patterning and implanting impurity are performed using the masks, manufacturing cost is increased as the number of the masks is increased.

Accordingly, the first impurity is simultaneously, or nearly simultaneously, implanted into portions of the pixel pattern part 210, the storage pattern part 220 and the driving pattern part 230 so that the number of masks employed for manufacturing an array substrate is decreased.

The first impurity is simultaneously, or nearly simultaneously, implanted into the portions of the pixel pattern part, the storage pattern part and the driving pattern part. Therefore, the number of masks may be decreased.

According to exemplary embodiments of the present invention, the first impurity is simultaneously, or nearly simultaneously, implanted into portions of the pixel pattern part 210, the storage pattern part 220, and the driving pattern part 230.

What is claimed is:

1. A method of manufacturing an array substrate comprising:
   forming one or more silicon patterns on a base substrate comprising a display region and a peripheral region, the peripheral region being formed in an outer area of the display region, the silicon patterns comprising a pixel pattern part formed in the display region, a storage pattern part in the display region, and a driving pattern part formed in the peripheral region;
   implanting a first impurity at a high concentration simultaneously into a first portion of the pixel pattern part, a first portion of the storage pattern part, and a first portion of the driving pattern part;
   forming one or more gate metal patterns on the silicon patterns using one or more photosensitive patterns having a first sub-sensitive layer and a second sub-sensitive layer;
   implanting a second impurity at a high concentration into the first portion of the driving pattern part;
   implanting the first impurity at a low concentration into a second portion of the pixel pattern part; and
   forming a pixel electrode that is electrically connected to the first portion of the pixel pattern part implanted with the first impurity at the high concentration,
   wherein the second impurity is implanted into a second portion of the driving pattern part at a high concentration though the first sub-sensitive layer of the one or more photosensitive patterns.

2. The method of claim 1, wherein the first impurity comprises ions of one or more group V elements, and the second impurity comprises ions of one or more group III elements.

3. The method of claim 2, wherein the pixel pattern part comprises:
   a pixel channel part without the first impurity;
   a pixel high concentration doping part formed on at least one edge of the pixel channel part and implanted with the first impurity at the high concentration; and
   a pixel low concentration doping part formed between the pixel channel part and the pixel high concentration doping part and implanted with the first impurity at the low concentration.

4. The method of claim 3, wherein the storage pattern part comprises a storage high concentration doping part implanted with the first impurity.

5. The method of claim 4, wherein the driving pattern part comprises:
   a driving channel part without the first impurity or the second impurity; and
   a driving high concentration doping part formed on at least one edge of the driving channel part and implanted with the first impurity or the second impurity.

6. The method of claim 5, wherein the gate metal patterns comprise:
   a gate line extended in a first direction;
   a pixel gate electrode extended from the gate line and overlapping with the pixel channel part;
   a storage line, which is spaced apart from the gate line and is extended in the first direction; and
   a storage electrode, which is electrically connected to the storage line and overlaps the storage high concentration doping part.

7. The method of claim 6, wherein the data metal patterns comprise:
   a data line extended in a second direction which is different from the first direction;
   a pixel source electrode extended from the data line and overlaps the pixel high concentration doping part and electrically connected to a first portion of the pixel high concentration doping part; and
   a pixel drain electrode, which is spaced apart from the pixel source electrode and is electrically connected to a second portion of the pixel high concentration doping part.

8. The method of claim 1, further comprising forming a first insulating layer on the base substrate such that the first insulating layer covers the silicon patterns.

9. The method of claim 8, wherein forming the gate metal patterns comprises:
   forming a gate metal layer on the first insulating layer;
   forming the one or more photosensitive patterns on the gate metal layer; and
   etching a portion of the gate metal layer using the one or more photosensitive patterns as an etching mask to form the gate metal patterns.

10. The method of claim 9, wherein
    the first sub-sensitive layer is formed on the gate metal layer, and the first sub-sensitive layer has substantially the same shape as the gate metal pattern; and
    wherein the second sub-sensitive layer is formed on the first sub-sensitive layer, and the second sub-sensitive layer has a different shape from the first sub-sensitive layer.

11. The method of claim 8, further comprising forming one or more data metal patterns that are electrically connected to the silicon patterns and implanted with the first impurity at the high concentration after implanting the first impurity at the low concentration.

12. The method of claim 11, wherein forming the data metal patterns comprises:
    forming a second insulating layer such that the second insulating layer covers the gate metal patterns;
    etching the first and second insulating layer simultaneously to form a data contact hole; and
    forming the data metal patterns that are electrically connected to the silicon patterns through the data contact hole.

13. The method of claim 12, wherein the data metal patterns are electrically connected to the first portion of the pixel pattern part implanted with the first impurity at the high concentration.

14. The method of claim 13, wherein forming the pixel electrode comprises:
forming a third insulating layer on the second insulating layer such that the third insulating layer covers the data metal patterns;
forming a pixel contact hole in the third insulating layer; and forming the pixel electrode that is electrically connected to the data metal patterns through the pixel contact hole.

15. The method of claim 1, wherein the one or more photosensitive patterns comprise one or more second photosensitive patterns and implanting the first impurity at the high concentration comprises:
forming one or more first photosensitive patterns on the first insulating layer;
implanting the first impurity at the high concentration into the first portion of the pixel pattern part, the first portion of the storage pattern part, and the first portion of the driving pattern part by using the first photosensitive patterns as a mask; and
removing the first photosensitive patterns.

16. The method of claim 1, wherein implanting the first impurity at the low concentration comprises:
removing the first sub-sensitive layer of the one or more photosensitive patterns;
etching the gate metal patterns using the second sub-sensitive layer as an etching mask;
implanting the first impurity into the second portion of the pixel pattern part at the low concentration using the second sub-sensitive layer; and
removing the second sub-sensitive layer.

* * * * *